(12) United States Patent
Kimura et al.

(10) Patent No.: US 8,530,254 B2
(45) Date of Patent: Sep. 10, 2013

(54) METHOD OF MANUFACTURING ORGANIC ELECTROLUMINESCENCE DEVICE

(75) Inventors: Toshihide Kimura, Ebina (JP); Tomoyuki Hiroki, Mobara (JP); Taro Endo, Kawasaki (JP); Itaru Takaya, Chiba (JP); Koichi Ishige, Mobara (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 24 days.

(21) Appl. No.: 13/432,724

(22) Filed: Mar. 28, 2012

(65) Prior Publication Data

US 2012/0252151 A1     Oct. 4, 2012

(30) Foreign Application Priority Data

Mar. 30, 2011    (JP) ................. 2011-074837

(51) Int. Cl.
     *H01L 21/00*      (2006.01)
     *H01L 51/40*      (2006.01)

(52) U.S. Cl.
     USPC .......... 438/35; 438/34; 438/99; 257/E51.018; 257/E51.022

(58) Field of Classification Search
     USPC .................................... 438/35; 257/E51.022
     See application file for complete search history.

(56) References Cited

U.S. PATENT DOCUMENTS

| | | | |
|---|---|---|---|
| 6,617,186 B2 | 9/2003 | Kashiwabara et al. | |
| 7,147,992 B2 | 12/2006 | Itou et al. | |
| 7,220,998 B2 | 5/2007 | Kashiwabara et al. | |
| 7,396,637 B2 | 7/2008 | Itou et al. | |
| 7,615,388 B2 | 11/2009 | Kashiwabara et al. | |
| 8,021,203 B2 | 9/2011 | Kashiwabara et al. | |
| 2005/0079787 A1* | 4/2005 | Kashiwabara | 445/24 |
| 2012/0252143 A1* | 10/2012 | Otsuka et al. | 438/22 |
| 2012/0252149 A1 | 10/2012 | Hiroki et al. | |
| 2012/0252150 A1 | 10/2012 | Hiroki et al. | |
| 2012/0274239 A1 | 11/2012 | Endo et al. | |
| 2012/0274807 A1 | 11/2012 | Shiobara et al. | |

FOREIGN PATENT DOCUMENTS

| | | |
|---|---|---|
| JP | 2006-164993 A | 6/2006 |
| JP | 3839276 B2 | 11/2006 |

* cited by examiner

*Primary Examiner* — Daniel Whalen
(74) *Attorney, Agent, or Firm* — Fitzpatrick, Cella, Harper & Scinto (57) ABSTRACT

A method of manufacturing an organic electroluminescence device includes forming a first organic electroluminescence layer at least on a first lower electrode, forming a first protective layer on the first organic electroluminescence layer, processing the first organic electroluminescence layer and the first protective layer, forming a second organic electroluminescence layer at least on a second lower electrode, forming a second protective layer on the second organic electroluminescence layer, and processing the second organic electroluminescence layer and the second protective layer. The second organic electroluminescence layer and the second protective layer, which have been processed by the processing the second organic electroluminescence layer and the second protective layer, cover an end portion of the first organic electroluminescence layer and an end portion of the first protective layer, which have been processed by the processing the first organic electroluminescence layer and the first protective layer.

7 Claims, 3 Drawing Sheets

METHOD OF MANUFACTURING ORGANIC ELECTROLUMINESCENCE DEVICE

BACKGROUND OF THE INVENTION

1. Field of the Invention

The present invention relates to a method of manufacturing an organic electroluminescence (EL) device.

2. Description of the Related Art

A generally known display device (display) having organic EL elements mounted thereon is a device in which pixels each including a single or multiple organic EL elements are arranged in a predetermined pattern. In such case, the organic EL elements included in the pixels are electronic elements which output, for example, any one of red light, green light, and blue light. A display device having organic EL elements mounted thereon obtains a full-color image by driving the organic EL elements for outputting desired colors at desired emission intensities.

By the way, in an organic EL element which is a component of a display device, an organic compound layer included in the element is a thin film layer formed by forming a thin film made of an organic material by vapor deposition or the like. When the organic compound layer which is included in the organic EL element of the display device is formed for each of the elements, a fine patterning technology is necessary. When patterning is carried out in vapor deposition, a fine metal mask corresponding to the fineness of the patterning is necessary. However, when a metal mask is repeatedly used for vapor deposition, a vapor deposited film may adhere to narrow an opening in the mask, or stress may deform the opening in the mask. Therefore, it is necessary to clean the used mask after performing film formation for a fixed number of times, which is a disadvantageous factor from the viewpoint of manufacturing costs. In addition, due to a limitation on the process accuracy of the mask, the pixel size has a limit of about 100 μm, which is disadvantageous to a finer size of a display device. Further, in terms of the substrate size, when a fine metal mask is increased in size, in order to secure the positional accuracy of the opening in the mask, it is necessary to enhance the stiffness of a frame of the mask. However, when the stiffness of the mask is enhanced, the weight of the mask itself is increased accordingly. Therefore, from the viewpoint of both processability and handling, it is difficult to manufacture large display device of the fourth and subsequent generations, and an optimum manufacturing process of a fine organic EL element and a display device having the organic EL element mounted thereon has not taken shape at present.

Under those circumstances, there has been proposed a method of manufacturing a display device including a fine organic EL element without using a metal mask. Methods proposed in Japanese Patent Application Laid-Open No. 2006-164993 and Japanese Patent No. 3839276 are specific examples of such a method. The methods proposed in Japanese Patent Application Laid-Open No. 2006-164993 and Japanese Patent No. 3839276 are methods involving, after repeating three times for the respective colors a step of patterning by photolithography an organic compound layer formed on an entire surface of a substrate to leave the organic compound layer only in a predetermined location, forming a common electrode.

By the way, in the methods (manufacturing methods) proposed in Japanese Patent Application Laid-Open No. 2006-164993 and Japanese Patent No. 3839276, an organic EL layer is patterned by the process including the following steps of:

(a) forming an organic EL layer and a photoresist layer in this order on an entire surface of an emission region on a substrate having a lower electrode formed thereon;
(b) exposing a part of the photoresist layer in accordance with the pattern of the organic EL layer;
(c) removing by developing treatment a part of the photoresist layer which is not exposed; and
(d) removing by etching treatment a part of the organic EL layer provided in a region in which the photoresist layer is removed in the step (c).

According to the process, the photoresist layer provided in patterning is in a state of being selectively provided on the patterned organic EL layer, and thus, the photoresist layer may be easily released. After the photoresist layer is released, an upper electrode (common electrode) is formed.

By the way, when an organic EL device manufactured by the process including the above-mentioned steps (a) to (d) includes multiple kinds of organic EL elements which emit light of different colors, the process including the above-mentioned steps (a) to (d) is repeated for each kind. Then, a region in which no organic EL element is provided, for example, a pixel division layer (bank) provided between elements is subjected to the etching in the above-mentioned step (d) multiple times. Here, the pixel division layer (bank) provided in a region between elements and the like are not protected by the photoresist layer, and are thus subjected to the etching in the above-mentioned step (d). In a display in which organic EL elements of three colors, i.e., RGB, are arranged, when the above-mentioned patterning process (steps (a) to (d)) is carried out three times, members such as the pixel division layer (bank) are subjected to the etching three times at the maximum.

On the other hand, members such as the pixel division layer (bank) provided in a region between elements are usually formed of an insulating resin material such as a polyimide-based resin material or an acrylic-based resin material. The above-mentioned resin material is a hydrocarbon-based material including heteroatoms (such as oxygen atoms or nitrogen atoms) or not including heteroatoms. Therefore, in the etching in the above-mentioned step (d), such members may be etched at an etching rate which is equal to that of the organic EL layer. Then, a part of the members such as the pixel division layer is etched away to form a groove. If such a groove is formed, when the upper electrode (common electrode) to be provided on the entire surface of the emission region is formed after the organic EL layer is formed, a part of the upper electrode may be broken due to a step caused by the groove.

Further, when organic EL elements are arranged in a display device in a high density, it is preferred that wiring for inputting a drive signal to each of the organic EL elements be formed under an insulating layer such as the pixel division layer to electrically connect the wiring to a circuit for driving each of the organic EL elements and the like. In a case where a conductive layer such as an electrode layer or a wiring layer is formed under the insulating layer in this way, when the insulating layer is locally removed to a deep level by etching, the electrode layer or the conductive layer arranged under the insulating layer is exposed. Then, a short circuit may be caused with the upper electrode when the upper electrode is formed.

SUMMARY OF THE INVENTION

The present invention has been made to solve the above-mentioned problems, and an object of the present invention is to provide a method of manufacturing an organic electroluminescence device, which is capable of preventing a member provided in a region between elements from being damaged when an organic electroluminescence layer is patterned by photolithography.

According to an exemplary embodiment of the present invention, there is provided a method of manufacturing an organic electroluminescence device, the organic electroluminescence device including a first organic electroluminescence element and a second organic electroluminescence element, the first organic electroluminescence element including a first lower electrode, a first organic electroluminescence layer, and an upper electrode, the second organic electroluminescence element including a second lower electrode, a second organic electroluminescence layer, and the upper electrode, the first organic electroluminescence element emitting color of light different from color of light emitted from the second organic electroluminescence element, the method including: forming the first organic electroluminescence layer at least on the first lower electrode; forming a first protective layer on the first organic electroluminescence layer; patterning the first organic electroluminescence layer and the first protective layer so as to selectively remain on the first lower electrode; forming the second organic electroluminescence layer at least on the second lower electrode; forming a second protective layer on the second organic electroluminescence layer; patterning the second organic electroluminescence layer and the second protective layer so as to selectively remain on the second lower electrode; removing the first protective layer and the second protective layer; and forming the upper electrode on the first organic electroluminescence layer and the second organic electroluminescence layer, in which the second organic electroluminescence layer and the second protective layer, which have been processed by the patterning the second organic electroluminescence layer and the second protective layer, cover an end portion of the first organic electroluminescence layer and an end portion of the first protective layer, which have been processed by the patterning the first organic electroluminescence layer and the first protective layer.

According to the present invention, there may be provided a method of manufacturing an organic electroluminescence device, which is capable of preventing a member provided in a region between elements from being damaged when an organic electroluminescence layer is patterned by photolithography.

More specifically, by adopting the manufacturing method according to the present invention, in the step of etching an organic EL layer, the number of times an insulating member such as a pixel division layer which is provided between elements may be reduced. Therefore, even when an electrode layer or a conductive layer is formed under the above-mentioned insulating member, a short circuit with the upper electrode due to exposure of the electrode layer or the conductive layer or a break in the upper electrode due to damage of the insulating member (formation of a groove) in the step of etching the organic EL layer may be prevented.

Further, even when an electrode layer or a conductive layer is formed under a layer made of an insulating member such as a pixel division layer, it is not necessary to take into consideration the location of the electrode layer or the conductive layer in selecting the location at which the photoresist layer is patterned, and thus, the margin of alignment accuracy may be narrow. This eliminates the need for securing a large width of the insulating layer, and thus, a fine organic EL device may be materialized with ease.

Further features of the present invention will become apparent from the following description of exemplary embodiments with reference to the attached drawings.

DESCRIPTION OF THE EMBODIMENTS

A method of manufacturing an organic EL device according to the present invention is a method of manufacturing an organic EL device at least including (in an emission region thereof) a first organic EL element and a second organic EL element. Here, the first organic EL element includes a first lower electrode, a first organic EL layer, and an upper electrode from a substrate side. The second organic EL element includes a second lower electrode, a second organic EL layer, and the upper electrode from the substrate side. The upper electrode is an electrode which is electrically common to the first organic EL element and the second organic EL element. Note that, according to the present invention, the first organic EL element emitting color of light different from color of light emitted from the second organic EL element.

The method of manufacturing an organic EL device according to the present invention at least includes the following steps (A) to (H):
(A) a step of forming the first organic EL layer at least on the first lower electrode;
(B) a step of forming a first protective layer on the first organic EL layer;
(C) a step of processing the first organic EL layer and the first protective layer in a predetermined pattern;
(D) a step of forming the second organic EL layer at least on the second lower electrode;
(E) a step of forming a second protective layer on the second organic EL layer;
(F) a step of processing the second organic EL layer and the second protective layer in a predetermined pattern;
(G) a step of removing the first and second protective layers; and
(H) a step of forming the upper electrode on the first organic EL layer and the second organic EL layer.

According to the present invention, the second organic EL layer and the second protective layer, which have been processed in the step (F), that is, in the step of processing the second organic EL layer and the second protective layer in a predetermined pattern, cover an end portion of the first organic EL layer and an end portion of the first protective layer, which have been processed in the step (C), that is, in the step of processing the first organic EL layer and the first protective layer in a predetermined pattern.

The present invention is described in detail in the following with reference to the attached drawings. Note that, a well-known or publicly known technology in the art may be applied to what is not specifically described in the following and what is not specifically illustrated in the attached drawings. Further, an embodiment described in the following is only an exemplary embodiment of the method of manufacturing an organic EL device according to the present invention, and the present invention is not limited thereto.

Figure 1A:
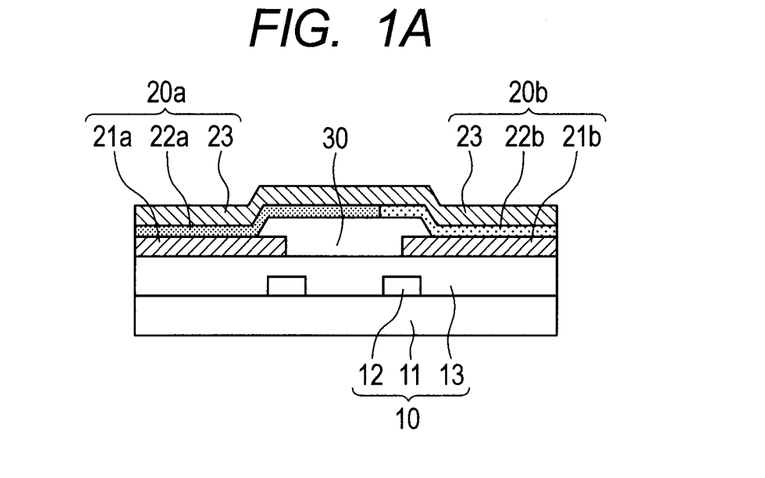
FIGS. 1A and 1B are a schematic sectional view and a schematic view, respectively, illustrating an exemplary organic EL device manufactured by a manufacturing method according to the present invention.
Figure 1B:
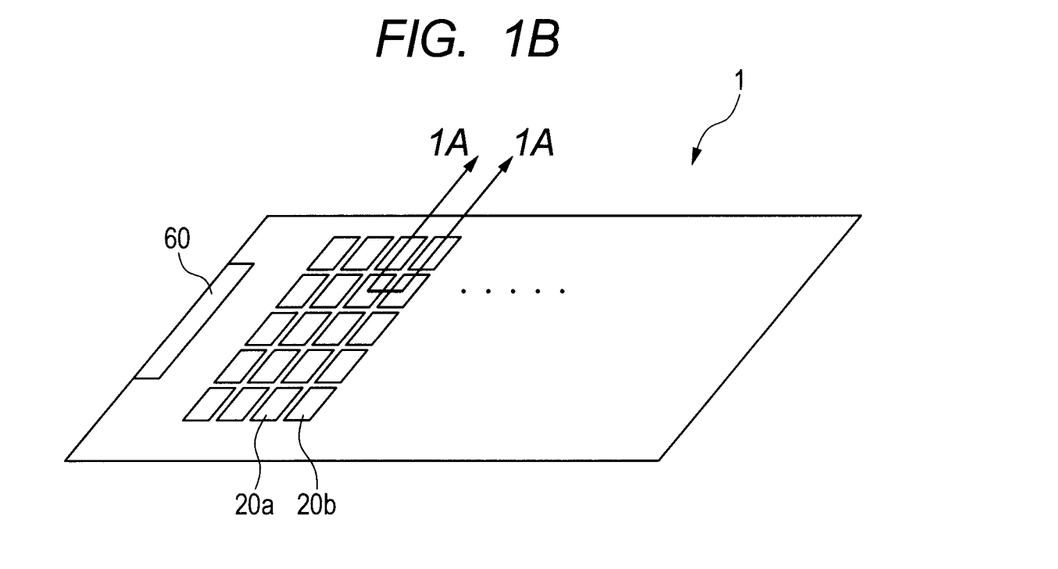

FIG. 1B is a perspective view illustrating an exemplary organic EL device manufactured by the manufacturing method according to the present invention, and FIG. 1A is a schematic sectional view taken along the line 1A-1A of FIG. 1B.

In an organic EL device 1 illustrated in FIG. 1A, two kinds of organic EL elements, that is, first organic EL elements 20a and second organic EL elements 20b, are provided on a substrate 10 which is provided with an external connection terminal portion 60. As illustrated in FIG. 1B, the two kinds of organic EL elements (20a and 20b) are provided on the substrate 10 so as to be spaced with a pixel division layer 30 therebetween.

The substrate 10 includes a base 11, a conductive layer 12 provided on the base 11, and a planarized passivation layer 13 provided on the base 11 for covering the conductive layer 12. A terminal of the external connection terminal portion 60 is electrically connected by the conductive layer 12 to a lower electrode or an upper electrode of each of the organic EL elements.

As illustrated in FIG. 1B, the first organic EL element 20a includes a first lower electrode 21a provided on the planarized passivation layer 13, a first organic EL layer 22a provided on the first lower electrode 21a, and an upper electrode 23 provided on the first organic EL layer 22a.

The second organic EL element 20b includes a second lower electrode 21b provided on the planarized passivation layer 13, a second organic EL layer 22b provided on the second lower electrode 21b, and the upper electrode 23 provided on the second organic EL layer 22b. The first lower electrodes 21a and the second lower electrodes 21b are separately formed with regard to each of the organic EL elements. The upper electrode 23 is formed so as to be common to the first organic EL elements 20a and the second organic EL elements 20b.

Note that, the organic EL device 1 illustrated in FIGS. 1A and 1B is an active matrix display device, but the present invention may also be applied to a passive matrix display device.

Next, components of the organic EL device 1 illustrated in FIGS. 1A and 1B are described.

(Base)

As the base 11 which is a component of the substrate 10, a support made of an insulating material such as glass or a semiconductor material such as silicon is suitably used.

(Conductive Layer)

The conductive layer 12 which forms the substrate 10 is a thin film layer which is placed below the insulating layers (the planarized passivation layer 13 and the pixel division layer 30) and which is made of a conductive material. The conductive layer 12 includes, for example, a drive circuit such as a TFT circuit which enables individual driving of the organic EL elements, a wiring layer for electrically connecting the drive circuit to the lower electrodes (21a and 21b), and a contact hole for electrically connecting the drive circuit or the wiring layer to the lower electrodes (21a and 21b).

As a constituent material of the conductive layer 12, a metal material such as Al is suitably used.

(Planarized Passivation Layer)

The planarized passivation layer 13 is provided for filling in unevenness portions produced by providing the conductive layer 12 and for planarizing the substrate 10. As a constituent material of the planarized passivation layer 13, an insulating material may be used. More specifically, a resin-based material such as a polyimide-based material or an acrylic material, or an inorganic material such as silicon nitride may be used.

(Lower Electrode)

When the organic EL elements (20a and 20b) provided on the substrate 10 are top emission type organic EL elements, it is preferred that the lower electrodes (21a and 21b) provided on the substrate side with respect to the organic EL layers (22a and 22b) be electrodes which reflect light (reflective electrodes). When the lower electrodes (21a and 21b) are reflective electrodes, the lower electrodes (21a and 21b) are metal electrodes, and exemplary constituent materials thereof include metal materials such as Al and Ag and alloys of combinations of multiple kinds thereof. Note that, when the manufacturing process for the organic EL device includes a wet process (for example, a step of developing a resist or a step of carrying out wet etching), a laminated electrode including a thin film layer made of the above-mentioned metal material or alloy and a conductive oxide film made of ITO or the like is also suitably used. When the organic EL elements (20a and 20b) provided on the substrate 10 are bottom emission type organic EL elements, the lower electrodes (21a and 21b) are required to be electrodes which transmit light (light transmitting electrodes). When the lower electrodes (21a and 21b) are light transmitting electrodes, exemplary constituent materials thereof include a conductive material which transmits light such as ITO. The term "light transmitting" as used herein means a property of having a visible light transmittance of 20% or more.

(Organic EL Layer)

Each of the organic EL layers (22a and 22b) provided on the lower electrodes (21a and 21b), respectively, is a single layer or a laminate of multiple layers including an emission layer (not shown) for emitting light of a predetermined color. The layer structure of each of the organic EL layers (22a and 22b) is not specifically limited insofar as an emission layer is included therein. Here, when each of the organic EL layers is a laminate of multiple layers, exemplary layers which may be included in each of the organic EL layers (22a and 22b) include, in addition to the emission layer, a hole injection layer, a hole transport layer, an electron transport layer, and an electron injection layer. Further, the combination of colors of light emitted by the emission layers included in the organic EL layers (22a and 22b) is not specifically limited, but a combination of red, green, and blue is the most popular one.

(Upper Electrode)

A constituent material of the upper electrode 23 which forms the organic EL elements (20a and 20b) may be appropriately selected in accordance with the properties of the organic EL elements. When the organic EL elements (20a and 20b) are top emission type organic EL elements, the upper electrode 23 is required to be a light transmitting electrode. In such a case, exemplary constituent materials of the upper electrode 23 include a conductive material which transmits light such as ITO. Further, a thin film made of a metal material such as Al or Ag having a thickness which allows the thin film to transmit light may also be used.

On the other hand, when the organic EL elements (20a and 20b) are bottom emission type organic EL elements, it is preferred that the upper electrode 23 be a reflective electrode. In such a case, exemplary constituent materials of the upper electrode 23 include metal materials such as Al and Ag and alloys of combinations of multiple kinds thereof.

(Pixel Division Layer)

The pixel division layer 30 is provided for the purpose of separating multiple organic EL elements included in the organic EL device from one another. As a constituent material of the pixel division layer 30, an insulating material may be used. More specifically, a resin-based material such as a polyimide-based one or an acrylic one or an inorganic material such as silicon nitride may be used.

Next, the method of manufacturing an organic EL device according to the present invention is described. As described above, the method of manufacturing an organic EL device according to the present invention at least includes the following steps (A) to (H):

(A) a step of forming the first organic EL layer at least on the first lower electrode;
(B) a step of forming a first protective layer on the first organic EL layer;
(C) a step of processing the first organic EL layer and the first protective layer in a predetermined pattern;
(D) a step of forming the second organic EL layer at least on the second lower electrode;
(E) a step of forming a second protective layer on the second organic EL layer;
(F) a step of processing the second organic EL layer and the second protective layer in a predetermined pattern;
(G) a step of removing the first and second protective layers; and
(H) a step of forming the upper electrode on the first organic EL layer and the second organic EL layer.

The method of manufacturing an organic EL device according to the present invention is described in the following with reference to the attached drawings. FIGS. 2A to 2H are schematic sectional views illustrating a method of manufacturing an organic EL device according to an embodiment of the present invention.

(1) Step of Manufacturing Substrate with Electrode

First, the lower electrodes 21a and 21b are patterned on the substrate 10 which is formed by laminating the base 11, the conductive layer 12, and the planarized passivation layer 13 in this order. The patterning may be carried out by a publicly known method. Next, a thin film made of an insulating material is formed in the entire emission region to cover the substrate 10 and the lower electrodes 21a and 21b. After that, predetermined patterning is carried out to form the pixel division layer 30 for separating the organic EL elements (20a and 20b) from one another. The patterning of the pixel division layer 30 may be carried out by a publicly known method.

Through the above-mentioned step, the substrate with electrodes having the lower electrodes 21a and 21b formed thereon is obtained.

(2) Step of Forming First Organic EL Layer (Step (A))

Next, the first organic EL layer 22a including a first emission layer (not shown) is formed at least on the first lower electrode 21a. Here, the first organic EL layer 22a may be formed on the entire surface of the emission region of the organic EL device. As the method of forming the first organic EL layer 22a, vacuum deposition, spin coating, or the like is suitably used.

(3) Step of Forming First Protective Layer (Step (B))

Figure 2A:
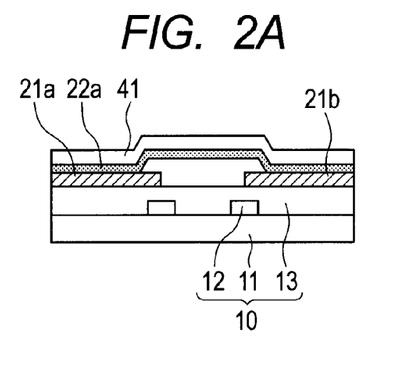
FIGS. 2A, 2B, 2C, 2D, 2E, 2F, 2G, and 2H are schematic sectional views illustrating a method of manufacturing an organic EL device according to an embodiment of the present invention.

Next, a first protective layer 41 is formed on the first organic EL layer 22a (FIG. 2A). The first protective layer 41 is a layer which protects the first organic EL layer 22a in the step of patterning the first organic EL layer 22a using photolithography (step of processing the first organic EL layer 22a). More specifically, the first protective layer 41 is a layer which protects the first organic EL layer 22a so that the first organic EL layer 22a is not affected by dissolution, swelling, etching, or the like in a step of forming a photoresist layer, a developing step, and an etching step.

By the way, the protective layer formed on and in contact with the organic EL layer is required to be removed in a subsequent step so that the organic EL layer is not affected by, for example, dissolving or swelling. Taking this point into consideration, as a constituent material of the protective layer, a material which may be dissolved in a solvent that does not dissolve a constituent material of the organic EL layer is suitably used. Here, when a constituent material of the organic EL layer is a material which is insoluble in water, exemplary constituent materials of the protective layer include a water-soluble high-molecular material which may be dissolved in water and a water-soluble inorganic salt. However, when the protective layer is only a thin film made of a water-soluble material, the protective layer itself may be dissolved, may swell, or the like in the step of forming the photoresist layer or in the developing step. Therefore, it is preferred that the protective layer be a laminate at least including a first layer (lower layer) which is made of a water-soluble material and a second layer (upper layer) which is formed on the first layer and which is made of a water-insoluble material. More specifically, by providing the layer made of a water-soluble material (first layer), the protective layer itself may be easily removed by water or a solvent containing water. On the other hand, by providing on the first layer the layer made of a water-insoluble material (second layer), the first layer may be prevented from being dissolved, swelling, or the like when the photoresist layer is formed and developed. Further, by forming the protective layer as a laminate including the first layer and the second layer, the organic EL layer may be prevented from being etched in the step of removing the resist and in the step of removing the protective layer to be described later. To prevent the first layer made of a water-soluble material from dissolving or swelling by a solvent, the second layer made of a water-insoluble material preferably includes an inorganic material having high moisture resistance such as silicon nitride and silicon oxide.

As the method of forming the first protective layer 41, a suitable method may be appropriately selected from among publicly known or well-known methods in accordance with the material used as a constituent material of the first protective layer 41. Here, when the first protective layer 41 is a laminate described above, when a layer made of a water-soluble high-molecular material is formed as the first layer, spin coating, dip coating, or the like may be adopted. When a layer made of a water-soluble inorganic salt is formed, vacuum deposition or the like may be used. Further, when a layer made of a water-insoluble material is formed as the second layer, a suitable method may be appropriately selected from among spin coating, vacuum deposition, sputtering, CVD, and the like.

(4) Step of Processing First Organic EL Layer and First Protective Layer (Step (C))

After the first protective layer 41 is formed, the first organic EL layer 22a and the first protective layer 41 are processed in a predetermined pattern. Exemplary methods of processing the first organic EL layer 22a and the first protective layer 41 include photolithography.

In the following, a schematic example of processing the first organic EL layer 22a and the first protective layer 41 using photolithography is described.

First, a thin film made of, for example, a positive resist material is formed on the first protective layer 41 to form a photoresist layer 43. Here, as the resist material used in forming the photoresist layer 43, a publicly known one may be used. Further, as the method of forming the photoresist layer 43, an existing method such as spin coating, dip coating, or an ink jet method may be used.

Next, a photomask 50 having an opening in a processing region (removal region) of the first organic EL layer 22a is used in applying ultraviolet light 51. More specifically, the application region of the ultraviolet light 51 is coincident with the processing region of the first organic EL layer 22a and the first protective layer 41.

The ultraviolet light 51 may be applied using an existing apparatus. Further, the photomask 50 to be used only needs to shield ultraviolet light, and a photomask made of, for example, a Cr thin film, which is used as an ordinary photomask, may be used as the photomask 50.

Here, it is necessary to provide the first organic EL layer 22a on a part of the first lower electrode 21a which is not covered with the pixel division layer 30 (in a region in which the first organic EL element 20a is provided). Therefore, the processing region of the first organic EL layer 22a and the first protective layer 41 is, at the maximum, the entire display region except for the region in which the first organic EL elements 20a are provided. Further, taking into consideration the protection of the pixel division layer in etching, it is desired that the processing region of the first organic EL layer 22a and the first protective layer 41 be as small as possible. However, it is necessary to provide the second organic EL layer 22b on a part of the second lower electrode 21b which is not covered with the pixel division layer 30 (in a region in which the second organic EL element 20b is provided). Therefore, the processing region of the first organic EL layer 22a and the first protective layer 41 is, at the minimum, a region in which the second organic EL elements 20b are provided. However, if the processing region of the first organic EL layer 22a and the first protective layer 41 is only the region in which the second organic EL elements 20b are provided, it is sometimes difficult to secure a margin of process accuracy of the photolithography. Therefore, it is preferred that the processing region of the first organic EL layer 22a and the first protective layer 41 be the region in which the second organic EL elements 20b are provided and the surroundings thereof.

In the following, the processing region of the first organic EL layer 22a and the first protective layer 41 is described more specifically with reference to FIG. 3.

Figure 3:
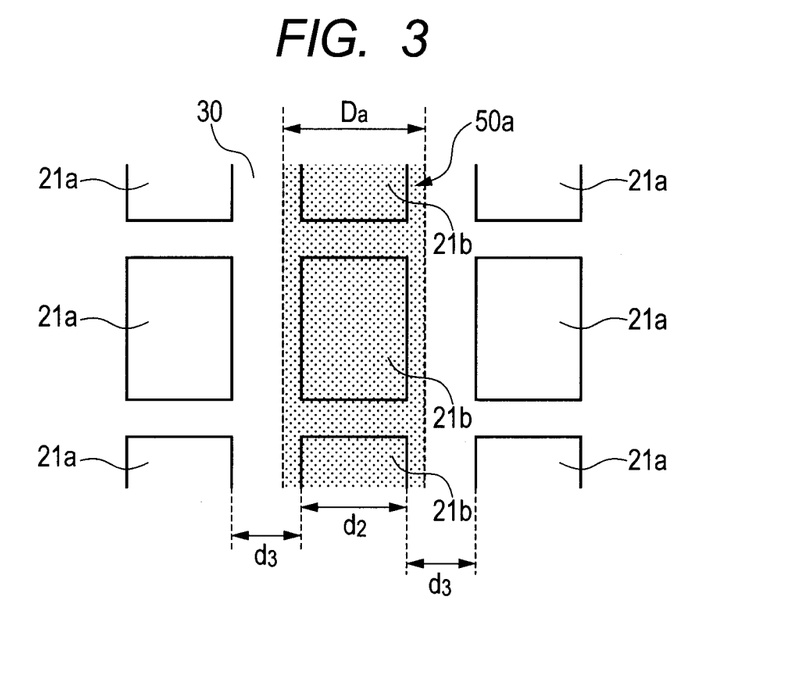
FIG. 3 is a schematic plan view illustrating a specific example of a processing region of a first organic EL layer and a first protective layer.

FIG. 3 is a schematic plan view illustrating a specific example of the processing region of the first organic EL layer 22a and the first protective layer 41. Note that, for the sake of simplicity of description, in FIG. 3, illustration of the first organic EL layer 22a and the first protective layer 41 is omitted.

By the way, in the embodiment illustrated in FIG. 3, the first lower electrodes 21a and the second lower electrodes 21b which are not covered with the pixel division layer 30 are arranged in the shape of stripes. More specifically, FIG. 3 illustrates a case where the two kinds of organic EL elements are arranged in the shape of stripes. In this case, an opening 50a in the photomask 50 used in the step of processing the first organic EL layer 22a and the first protective layer 41 is set so that the second lower electrodes 21b and the surroundings thereof are in the application region of the ultraviolet light 51. Here, the width of the opening 50a is represented by $D_a$ as illustrated in FIG. 3. Further, the width of the second lower electrodes 21b which are not covered with the pixel division layer 30 is represented by $d_2$ and the width of the pixel division layer 30 is represented by $d_3$. The range of $D_a$ is expressed as follows:

$$d_2 \leq D_a \leq d_2 + 2d_3.$$

However, taking into consideration that the first organic EL layer 22a and the first protective layer 41 should be covered with the second organic EL layer 22b and a second protective layer 42 and that the margin of process accuracy of the photolithography described above should be secured, a preferred range of $D_a$ is expressed as follows:

$$d_2 < D_a < d_2 + d_3.$$

Note that, the above description is with regard to a case where two kinds of organic EL elements are arranged in the shape of stripes, but the manufacturing method according to the present invention may be applied even if two kinds of organic EL elements are arranged in a shape other than stripes (delta-like arrangement or the like). In such a case, taking into consideration the region in which the second organic EL elements 20b are provided, the processing region of the first organic EL layer 22a and the first protective layer 41 is determined. As described above, it is preferred that the region in which the second organic EL elements 20b are provided and the surroundings thereof be the processing region of the first organic EL layer 22a and the first protective layer 41.

Next, the photoresist layer 43 is developed to remove the photoresist layer 43 in the region which is exposed to the ultraviolet light in the preceding step. As a developer used in developing the photoresist layer 43, a publicly known one may be used. For example, when the photoresist material is a polyimide-based material, an alkaline-solution-based developer may be used.

Then, etching is carried out to remove the first protective layer 41 and the first organic EL layer 22a provided in the region in which the photoresist layer 43 is removed. As the method of the etching, an existing method such as wet etching or dry etching may be used. Note that, when the first protective layer 41 has a laminate structure described above, a method in which methods of removing the respective layers, which are appropriate for the respective layers, are applied in sequence to remove the respective layers may be adopted, but a method in which the laminate structure is collectively removed may also be adopted.

Further, when the first protective layer 41 in the region which is not covered with the photoresist layer 43 is removed, the photoresist layer 43 and a part of the first protective layer 41 thereunder may be simultaneously removed. This may facilitate release of the first protective layer 41.

On the other hand, the method of removing the first organic EL layer 22a is not specifically limited, and an existing method such as wet etching or dry etching may be used. However, dry etching is preferred because side etching by a solvent is not caused.

Figure 2B:
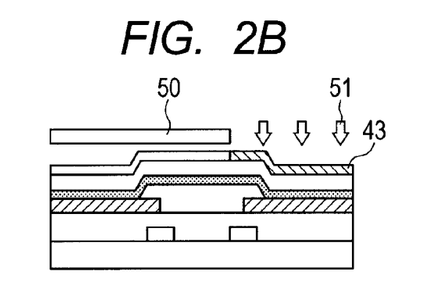
Figure 2C:
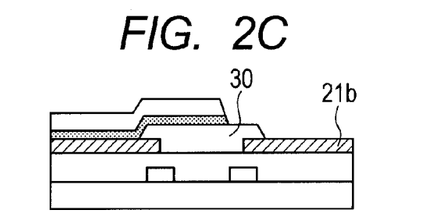

This etching removes the first organic EL layer 22a and the first protective layer 41 which cover the second lower electrode 21b and the pixel division layer 30 on the periphery of the second lower electrode 21b (FIG. 2C).

(5) Step of Forming Second Organic EL Layer and Second Protective Layer (Steps (D) and (E))

Next, the second organic EL layer 22b including a second emission layer (not shown) is formed on the entire surface of the emission region on the substrate. As the method of forming the second organic EL layer 22b, a method similar to that of the first organic EL layer (vacuum deposition, spin coating, or the like) is suitably used.

Figure 2D:
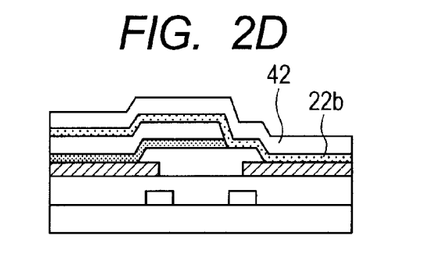

Then, the second protective layer 42 is formed on the second organic EL layer 22b (FIG. 2D). When the second protective layer 42 is formed, a method which is similar to that of forming the first protective layer 41 may be used.

(6) Step of Processing Second Organic EL Layer and Second Protective Layer (Step (F))

After the second protective layer 42 is formed, the second organic EL layer 22b and the second protective layer 42 are processed in a predetermined pattern. Exemplary methods of processing the second organic EL layer 22b and the second protective layer 42 include photolithography similarly to the first organic EL layer 22a and the first protective layer 41.

In the following, a schematic example of processing the second organic EL layer 22b and the second protective layer 42 using photolithography is described.

First, a thin film made of, for example, a positive resist material is formed on the second protective layer 42 to form a photoresist layer 44. Next, the photomask 50 having an opening in a processing region (removal region) of the second organic EL layer 22b is used in applying ultraviolet light 52. More specifically, the application region of the ultraviolet light 52 is coincident with a processing region of the second organic EL layer 22b and the second protective layer 42.

Here, the processing region of the second organic EL layer 22b and the second protective layer 42 is a region which may be relatively defined with respect to the processing region of the first organic EL layer 22a and the first protective layer 41. Further, the processing region of the second organic EL layer 22b and the second protective layer 42 is not specifically limited insofar as the second organic EL layer 22b and the second protective layer 42 cover the end portions of the first organic EL layer 22a and of the first protective layer 41.

In the following, the processing region of the second organic EL layer 22b and the second protective layer 42 is described more specifically with reference to FIG. 4.

Figure 4:
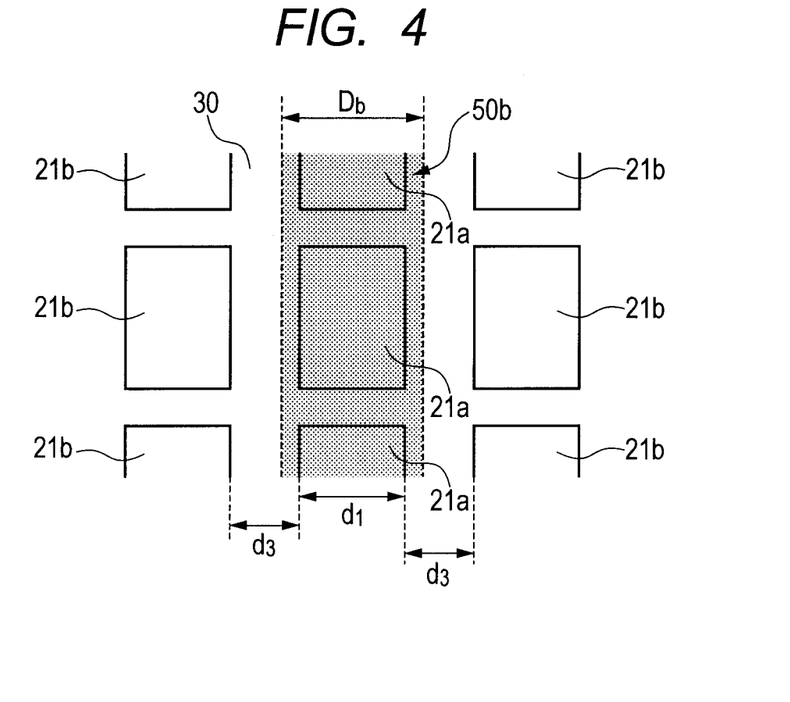
FIG. 4 is a schematic plan view illustrating a specific example of a processing region of a second organic EL layer and a second protective layer.

FIG. 4 is a schematic plan view illustrating a specific example of the processing region of the second organic EL layer 22b and the second protective layer 42. Note that, for the sake of simplicity of description, in FIG. 4, illustration of the second organic EL layer 22b and the second protective layer 42 is omitted.

By the way, in the embodiment illustrated in FIG. 4, the first lower electrodes 21a and the second lower electrodes 21b which are not covered with the pixel division layer 30 are arranged in the shape of stripes. In this case, an opening 50b in the photomask used in the step of processing the second organic EL layer and the second protective layer is set so that at least a part of the region of the first lower electrodes 21a is in the application region of the ultraviolet light 52. Here, the width of the opening 50b is represented by $D_b$ as illustrated in FIG. 4. $D_b$ is appropriately set in a range in which the second organic EL layer 22b and the second protective layer 42 may cover the end portions of the first organic EL layer 22a and of the first protective layer 41. For example, as illustrated in FIG. 4, the opening 50b may be set to be a region including the first lower electrodes 21a which are not covered with the pixel division layer 30 and the surroundings thereof, but the present invention is not limited thereto.

By the way, the width ($D_b$) of the opening 50b may be set after the pattern of the first protective layer 41 which appears in the step of processing the first organic EL layer 22a and the first protective layer 41 is observed. However, instead of the observation of the pattern of the first protective layer 41, $D_b$ may be set in advance in accordance with design which takes into consideration the dimensions of the opening (50a in FIG. 3) of the photomask used in the step of processing the first organic EL layer 22a and the first protective layer 41 and the process accuracy of the photolithography. When the manufacturing method according to the present invention is applied to a production line of an organic EL device, it is preferred that $D_b$ be set in advance in accordance with the above-mentioned design.

Figure 2E:
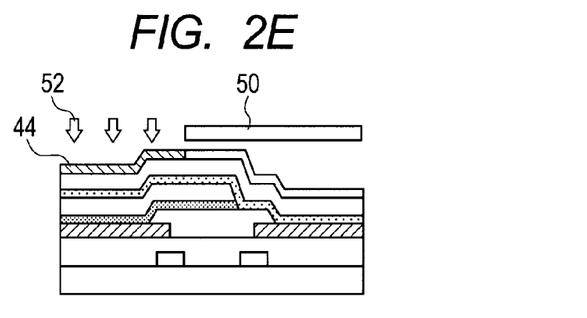
Figure 2F:
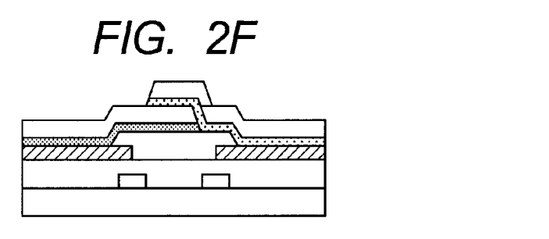

Next, the photoresist layer 44 is developed to remove the photoresist layer 44 in the region which is exposed to the ultraviolet light in the preceding step. Then, etching is carried out to remove the second protective layer 42 and the second organic EL layer 22b provided in the region in which the photoresist layer 44 is removed. Note that, when the etching is carried out, a part of the photoresist layer 44 and a part of the second protective layer 42 provided in the region shielded by the photomask 50 may be simultaneously removed. This etching removes a part of the second protective layer 42, a part of the second organic EL layer 22b, and a part of the first protective layer 41 (FIG. 2F).

(7) Step of Removing Protective Layers

Figure 2G:
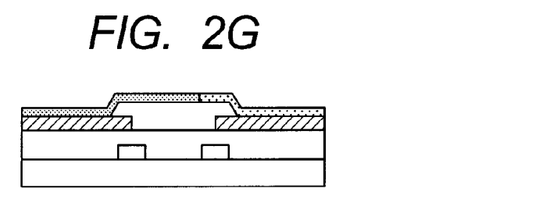

Next, a step of removing the protective layers (the first protective layer 41 and the second protective layer 42) from the organic EL layer is carried out. After the step of processing the second protective layer 42 and the second organic EL layer 22b is completed, as illustrated in FIG. 2F, the protective layers (the first protective layer 41 and the second protective layer 42) remain on the entire surface of the organic EL layers (the first organic EL layer 22a and the second organic EL layer 22b). From this state, the protective layers (the first protective layer 41 and the second protective layer 42) are removed (FIG. 2G). As the specific method of removing the protective layers, an existing method such as wet etching or dry etching may be used. Note that, when the photoresist layers remain on the protective layers, the photoresist layers may be simultaneously removed in this removing step, or, after the photoresist layers are removed in advance by etching or the like, this removing step may be carried out. However, it is preferred that, in order to facilitate the removal of the protective layers in the region in which the second protective layer 42 covers the first protective layer 41, the photoresist layers be removed in advance in the step of processing the protective layers.

(8) Step of Forming Upper Electrode

Figure 2H:
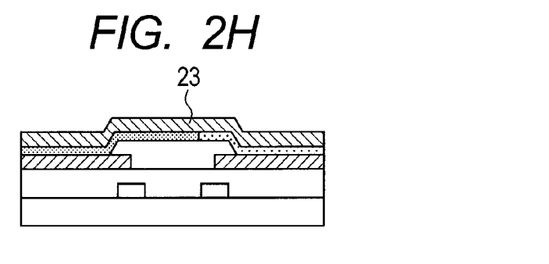

Finally, the upper electrode 23 is formed on the organic EL layers (22a and 22b), thereby completing the organic EL device (FIG. 2H). Here, the upper electrode 23 may be an electrode which is simultaneously formed on the organic EL elements, or, may be electrodes which are individually formed with respect to each organic EL element insofar as the electrodes are electrically connected to one another.

The manufacturing method described above is a method of manufacturing an organic EL device having two kinds of organic EL elements which emit different colors of light, but the present invention is not limited thereto. When the number of emission colors is three or more, by repeating the step of forming the organic EL layer and the protective layer and the step of processing the organic EL layer and the protective layer illustrated in FIGS. 2D to 2F, such an organic EL device may be manufactured.

As described above, by adopting the manufacturing method according to the present invention, the pixel division layer 30 is protected by a protective layer at least once when organic EL layers and protective layers are processed, and thus, damage of the pixel division layer 30 may be alleviated.

In the following, examples of the method of manufacturing an organic EL device according to the present invention are described in detail. However, the present invention is not limited thereto.

Example 1

The organic EL device illustrated in FIGS. 1A and 1B was manufactured by the manufacturing method illustrated in FIGS. 2A to 2H. Here, some of the materials used in this example are expressed in the following:

(1) Step of Forming Substrate

First, the substrate was manufactured which included the base 11, the external connection terminal portion 60, a TFT circuit (not shown) provided on the base 11, an interlayer insulating film (planarized passivation layer 13) formed on the TFT circuit, and a contact hole (not shown) for electrically connecting the TFT circuit and a wiring layer (conductive layer 12) to the lower electrodes. More specifically, first, a film of Al was formed on the base 11 having the TFT circuit (not shown) formed thereon to form an Al layer. Then, the Al layer was patterned by an existing photolithography step to form the wiring layer (conductive layer 12). Next, a polyimide film was formed. Then, by an existing photolithography step, the polyimide film was patterned. In this way, the planarized passivation layer 13 made of an insulating material was formed.

(2) Step of Forming Lower Electrode

Next, a film of Al and a film of ITO were formed in sequence. Here, the thicknesses of the Al film and the ITO film were 100 nm and 30 nm, respectively. Then, the laminated film including the Al film and the ITO film was patterned by an existing photolithography step. In this way, a lower electrode 21a as a component of the first organic EL element 20a and a lower electrode 21b as a component of the second organic EL element 20b were formed.

(3) Step of Forming Pixel Division Layer

Next, a film of a polyimide-based resin was formed on the substrate 10 and the lower electrodes (21a and 21b) to form the insulating layer. Then, the insulating layer was processed by an existing photolithography step to form the pixel division layer 30.

(4) Step of Forming First Organic EL Layer

Then, by vacuum deposition, the first organic EL layer 22a including a first hole transport layer, the first emission layer, and a first electron transport layer was formed in the entire emission region on the lower electrodes (21a and 21b). More specifically, first, a film of Compound 1 was formed on the lower electrodes (21a and 21b) to form the first hole transport layer. Here, the thickness of the first hole transport layer was 100 nm, the degree of vacuum was $1\times10^{-4}$ Pa, and the deposition rate was 0.2 nm/sec.

Then, Compound 2 (host) and Compound 3 (guest) were co-evaporated on the first hole transport layer so that the weight ratio thereof was 80:20 to form the first emission layer. Here, the thickness of the first emission layer was 35 nm, the degree of vacuum during the vacuum deposition was $1\times10^{-4}$ Pa, and the deposition rate was 0.1 nm/sec. Note that, the first emission layer was an emission layer which emits blue light.

Next, Compound 4 was vacuum deposited on the first emission layer to form the first electron transport layer. Here, the thickness of the first electron transport layer was 10 nm, the degree of vacuum during the vacuum deposition was $1\times10^{-4}$ Pa, and the deposition rate was 0.1 nm/sec.

(5) Step of Forming First Protective Layer

Next, the first protective layer 41 for protecting the first organic EL layer 22a was formed (FIG. 2A). First, a polyvinylpyrrolidone aqueous solution prepared by mixing polyvinylpyrrolidone (PVP) and water was applied onto the first organic EL layer 22a by spin coating to form a PVP film (lower layer). Here, the thickness of the PVP film was 1 µm. Then, by CVD, a film of silicon nitride (SiN film) (upper layer) was formed on the PVP film. Here, the thickness of the SiN film was 1 µm.

(6) Step of Processing First Organic EL Layer and First Protective Layer

Next, by spin coating, a film made of a positive photoresist material (AZ1500 manufactured by AZ Electronic Materials S.A.) was formed on the first protective layer 41 to form the photoresist layer 43. Here, the thickness of the photoresist layer 43 was 1,000 nm.

Then, the photoresist layer 43 was patterned as described in the following. More specifically, an exposure apparatus manufactured by Canon Inc. under the trade name of MPA600 was used to expose the photoresist layer 43 using the photomask 50 having an opening in the processing region of the first protective layer 41 and the first organic EL layer 22a (FIG. 2B). Here, the exposure time was 40 seconds. With regard to the photomask 50 used here, with the use of a metal mask having an opening pattern which could shield a region beyond a center line between the first organic EL element and the adjacent second organic EL element, the region in which the photoresist layer 43 was removed was set so as not to overlap a region for emitting another color of light. Then, a developer (an aqueous solution of 50% 312MIF manufactured by AZ Electronic Materials S.A.) was used to carry out development for 1 minute. By dissolving in the developer the photosensitive resin to which ultraviolet light was applied, the photoresist layer was patterned. Here, the region in which the photoresist layer 43 remained was a region which extended beyond the center line with the adjacent second pixel (second organic EL element) correspondingly to the region shielded by the photomask.

Then, by dry etching, the first protective layer 41 and the first organic EL layer 22a provided in the region in which the photoresist layer 43 was removed in the preceding step were removed. Here, the etching progressed also in the region in which the photoresist layer 43 remained, and the photoresist layer 43 and a part of the first protective layer 41 (SiN film) were removed. Note that, dry etching was carried out first in the presence of gas ($CF_4$) which reacted with silicon nitride forming the first protective layer 41, and then, in the presence of gas (oxygen) which reacted with the water-soluble high-molecular film forming the first protective layer 41 and with the first organic EL layer 22a. Further, when the etching was carried out, the flow rate of the gases was 20 sccm, the pressure was 8 Pa, the power was 150 W, and the processing time was 5 minutes.

Through the above-mentioned step, as illustrated in FIG. 2C, the substrate was manufactured in which the first organic EL layer 22a was patterned at least in the region in which the first organic EL elements 20a were provided while the second lower electrode 21b (anode) was exposed.

(7) Step of Forming Second Organic EL Layer

Then, by vacuum deposition, the second organic EL layer 22b including a second hole transport layer, the second emission layer, and a second electron transport layer was formed in the entire emission region. More specifically, first, a film of Compound 1 was formed to form the second hole transport layer. Here, the thickness of the second hole transport layer was 200 nm, the degree of vacuum was $1\times10^{-4}$ Pa, and the deposition rate was 0.2 nm/sec.

Then, Compound 2 (host) and a red light emitting material (guest) were co-evaporated on the second hole transport layer so that the weight ratio thereof was 80:20 to form the second emission layer. Here, the thickness of the second emission layer was 20 nm, the degree of vacuum during the vacuum deposition was $1\times10^{-4}$ Pa, and the deposition rate was 0.1 nm/sec. Note that, the second emission layer was an emission layer which emits red light.

Next, Compound 4 was vacuum deposited on the second emission layer to form the second electron transport layer. Here, the thickness of the second electron transport layer was 10 nm, the degree of vacuum during the vacuum deposition was $1\times10^{-4}$ Pa, and the deposition rate was 0.1 nm/sec.

(8) Step of Forming Second Protective Layer

Next, the second protective layer 42 was formed on the second organic. EL layer 22b (FIG. 2D). Note that, the method of forming the second protective layer 42 is the same as that of the first protective layer 41.

(9) Step of Processing Second Organic EL Layer and Second Protective Layer

Next, by spin coating, a film made of a positive photoresist material (AZ1500 manufactured by AZ Electronic Materials S.A.) was formed on the second protective layer 42 to form the photoresist layer 44. Here, the thickness of the photoresist layer 44 was 1,000 nm.

Then, the photoresist layer 44 was patterned as described in the following. More specifically, an exposure apparatus manufactured by Canon Inc. under the trade name of MPA600 was used to expose the photoresist layer 44 using the photomask 50 having an opening in the processing region of the second protective layer 42 and the second organic EL layer 22b (FIG. 2E). Here, the exposure time was 40 seconds. With regard to the photomask 50 used here, with the use of a pattern which could shield a region beyond a center line between the second organic EL element and the adjacent first organic EL element, the region in which the photoresist layer was removed was set so as not to overlap a region for emitting another color of light. Then, a developer (an aqueous solution of 50% 312MIF manufactured by AZ Electronic Materials S.A.) was used to carry out development for 1 minute. By dissolving in the developer the photosensitive resin to which ultraviolet light was applied, the photoresist layer 44 was patterned. Here, the region in which the photoresist layer 44 remained was a region which extended beyond the center line with the adjacent first pixel (first organic EL element) correspondingly to the region shielded by the photomask.

Then, by dry etching, the second protective layer 42 and the second organic EL layer 22b provided in the region in which the photoresist layer was removed in the preceding step were removed. Here, the etching progressed also in the region in which the photoresist layer 44 remained, and the photoresist layer 44 and a part of the second protective layer 42 (SiN film) were removed. Note that, dry etching was carried out first in the presence of gas ($CF_4$) which reacted with silicon nitride forming the second protective layer 42, and then, in the presence of gas (oxygen) which reacted with the water-soluble high-molecular film forming the second protective layer 42 and with the second organic EL layer 22b. Further, when the etching was carried out, the flow rate of the gases was 20 sccm, the pressure was 8 Pa, the power was 150 W, and the processing time was 5 minutes.

Through the above-mentioned step, as illustrated in FIG. 2F, the organic EL layers were formed on the entire surface of the substrate with the protective layers remaining thereon and with the protective layers overlapping over a part of the insulating layer (pixel division layer 30).

(10) Step of Releasing Protective Layers

Next, after the SiN films forming the protective layers (41 and 42) were removed by dry etching, the PVP films forming the protective layers (41 and 42) were removed by cleaning with water for 2 minutes. Here, each of the protective layers (41 and 42) had a two-layer structure of the SiN film as the upper layer and the PVP film as the lower layer, and hence the protective layers could be easily released, though the two kinds of the protective layers (41 and 42) overlapped over the insulating layer (pixel division layer).

Through the above-mentioned step, as illustrated in FIG. 2G, the organic EL layers were exposed on the substrate.

(11) Step of Forming Upper Electrode and Subsequent Steps

Finally, as illustrated in FIG. 2H, a film of an AgMg alloy as the upper electrode 23 was formed at a thickness of 20 nm on the organic EL layers. By carrying out encapsulation using a glass cap, the organic EL device was completed.

(12) Evaluation of Apparatus

The completed organic EL device was driven. The result was that no short circuit or no break due to removal of the insulating layer was observed and satisfactory two color light emission was obtained.

Example 2

An organic EL device was manufactured in which two kinds of organic EL elements having different emission colors were arranged in the shape of stripes. Note that, the basic manufacturing process therefor was similar to that in Example 1. More specifically, this example was based on the manufacturing process illustrated in FIGS. 2A to 2H. In the following, points different from those in Example 1 are mainly described.

(1) Step of Processing First Organic EL Layer and First Protective Layer

First, in a way similar to that in Example 1, the lower electrodes (21a and 21b), the pixel division layer 30, the first organic EL layer 22a, and the first protective layer 41 were formed in sequence on the substrate 10. Next, by spin coating, a film made of a positive photoresist material (AZ1500 manufactured by AZ Electronic Materials S.A.) was formed on the first protective layer 41 to form the photoresist layer 43. Here, the thickness of the photoresist layer 43 was 1,000 nm.

Then, the photoresist layer 43 was patterned as described in the following. More specifically, an exposure apparatus manufactured by Canon Inc. under the trade name of MPA600 was used to expose the photoresist layer 43 using a photomask having an opening in the processing region of the first protective layer 41 and the first organic EL layer 22a. Note that, the photomask used in this step was, as illustrated in FIG. 3, a photomask in which the openings 50a having the width $D_a$ ($d_2 < D_a < d_2 + d_3$) were arranged in the shape of stripes. Further, when the photoresist layer 43 was exposed, as illustrated in FIG. 3, the photomask was placed so that the entire region in which the second lower electrodes 21b were provided was included in the opening 50a. Then, in a way similar to that in Example 1, the first organic EL layer 22a and the first protective layer 41 were processed.

(2) Step of Processing Second Organic EL Layer and Second Protective Layer

First, in a way similar to that in Example 1, the second organic EL layer 22b and the second protective layer 42 were formed in sequence. Next, by spin coating, a film made of a positive photoresist material (AZ1500 manufactured by AZ Electronic Materials S.A.) was formed on the second protective layer 42 to form the photoresist layer 44. Here, the thickness of the photoresist layer 44 was 1,000 nm.

Then, the photoresist layer 44 was patterned as described in the following. More specifically, an exposure apparatus manufactured by Canon Inc. under the trade name of MPA600 was used to expose the photoresist layer 44 using a photomask having an opening in the processing region of the second protective layer 42 and the second organic EL layer 22b. Note that, the photomask used in this step was, as illustrated in FIG. 4, a photomask in which the openings 50b having the width $D_b$ ($d_1 < D_b < d_1 + d_3$) were arranged in the shape of stripes. Further, when the photoresist layer 44 was exposed, as illustrated in FIG. 4, the photomask was placed so that the entire region in which the first lower electrodes 21a were provided was included in the opening 50a. Then, in a way similar to that in Example 1, the second organic EL layer 22b and the second protective layer 42 were processed.

(3) Step of Releasing Protective Layers and Subsequent Steps

Next, in a way similar to that in Example 1, a step of releasing the protective layers and a step of forming the upper electrode were carried out. By carrying out encapsulation using a glass cap, the organic EL device was completed.

(4) Evaluation of Apparatus

The completed organic EL device was driven. The result was that, similarly to Example 1, no short circuit or no break due to removal of the insulating layer was observed and satisfactory two color light emission was obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-074837, filed Mar. 30, 2011, which is hereby incorporated by reference herein in its entirety.

What is claimed is:

1. A method of manufacturing an organic electroluminescence device,
the organic electroluminescence device comprising a first organic electroluminescence element and a second organic electroluminescence element,
the first organic electroluminescence element including a first lower electrode, a first organic electroluminescence layer, and an upper electrode,
the second organic electroluminescence element including a second lower electrode, a second organic electroluminescence layer, and the upper electrode,
the first organic electroluminescence element emitting color of light different from color of light emitted from the second organic electroluminescence element, the method comprising:
forming the first organic electroluminescence layer at least on the first lower electrode;
forming a first protective layer on the first organic electroluminescence layer;
patterning the first organic electroluminescence layer and the first protective layer so as to selectively remain on the first lower electrode;
forming the second organic electroluminescence layer at least on the second lower electrode;
forming a second protective layer on the second organic electroluminescence layer;
patterning the second organic electroluminescence layer and the second protective layer so as to selectively remain on the second lower electrode;
removing the first protective layer and the second protective layer; and
forming the upper electrode on the first organic electroluminescence layer and the second organic electroluminescence layer,
wherein the second organic electroluminescence layer and the second protective layer, which have been processed by the patterning the second organic electroluminescence layer and the second protective layer, cover an end portion of the first organic electroluminescence layer and an end portion of the first protective layer, which have been processed by the patterning the first organic electroluminescence layer and the first protective layer.

2. The method of manufacturing an organic electroluminescence device according to claim 1, wherein the patterning first organic electroluminescence layer and the first protective layer and the patterning the second organic electroluminescence layer and the second protective layer comprise forming a photoresist layer by photolithography in a region where the respective layers selectively remain and removing the respective layers by etching in a region where the photoresist layer is not formed.

3. The method of manufacturing an organic electroluminescence device according to claim 2, wherein dry etching is used in the removing the respective layers by etching in a region where the photoresist layer is not formed.

4. The method of manufacturing an organic electroluminescence device according to claim 1, wherein the removing the first protective layer and the second protective layer dissolves at least a part of the first protective layer and the second protective layer with a solvent that does not dissolve the first organic electroluminescence layer and the second organic electroluminescence layer.

5. The method of manufacturing an organic electroluminescence device according to claim 4, wherein the solvent includes water, and each of the first protective layer and the second protective layer is a laminate at least including a first layer of a water-soluble material and a second layer of a water-insoluble material.

6. The method of manufacturing an organic electroluminescence device according to claim 5, wherein the first protective layer comprises a water-soluble high-molecular material and the second protective layer comprises an inorganic material having high moisture resistance.

7. The method of manufacturing an organic electroluminescence device according to claim 6, wherein the first protective layer includes polyvinylpyrrolidone and the second protective layer includes silicon nitride.

* * * * *